United States Patent [19]

Aigo

[11] Patent Number: 4,489,501

[45] Date of Patent: Dec. 25, 1984

[54] SPIN DRIER FOR SILICON WAFERS AND THE LIKE

[76] Inventor: Seiichiro Aigo, 3-15-13, Negishi, Daito-ku, Tokyo, Japan

[21] Appl. No.: 423,153

[22] Filed: Sep. 24, 1982

[30] Foreign Application Priority Data

Jul. 1, 1982 [JP] Japan .......................... 57-100519[U]

[51] Int. Cl.³ ............................................. F26B 11/18
[52] U.S. Cl. ............................................. 34/8; 34/58; 34/69; 34/187
[58] Field of Search ....................... 34/57 E, 58, 8, 69, 34/187, 188

[56] References Cited

U.S. PATENT DOCUMENTS

| | | | |
|---|---|---|---|
| 2,591,669 | 4/1952 | Bucknell et al. | 219/370 |
| 3,152,875 | 10/1964 | Davis et al. | 34/58 |
| 3,246,404 | 4/1966 | O'Conor | 34/58 |
| 3,566,582 | 3/1971 | Yankura | 34/58 |
| 4,087,924 | 5/1978 | Fujimoro et al. | 34/58 |

*Primary Examiner*—Larry I. Schwartz
*Assistant Examiner*—David W. Westphal
*Attorney, Agent, or Firm*—McGlew and Tuttle

[57] ABSTRACT

Disclosed herein is a spin drier for silicon wafers and the like including a rotor equipped with at least one holder for a carrier, which is adapted to enclose a silicon wafer or the like therein, and a casing embracing the rotor. The radial distance between the circumferential wall of the casing and the central axis of the rotor gradually increases as the circumferential wall extends all around the rotor in its circumferential direction from a position adjacent to an air exhaust port to the air exhaust port, thereby making an air conduit formed around the rotor gradually wider. The bottom wall of the casing gradually slopes down towards the air exhaust port. Owing to the above construction, the resistance to an air stream through the casing has been reduced, thereby preventing air from flowing back into the rotor after striking the circumferential wall of the casing and thus preventing stains and water on the circumferential wall of the casing from flowing back and sticking on wafers or the like.

6 Claims, 3 Drawing Figures

SPIN DRIER FOR SILICON WAFERS AND THE LIKE

BACKGROUND OF THE INVENTION

1. Field of the Invention

This invention relates to an improvement in or relating to an apparatus adapted to remove water droplets stuck on the surface of a silicon wafer or glass photomask by a centrifugal force and to dry same.

2. Description of the Prior Art

The above apparatus is used, after washing a silicon wafer or the like with water, to remove water and to dry the silicon wafer or the like. It is constructed of a rotor to be driven and a generally cylindrical casing which embraces the rotor. The rotor is provided with one or more holders each adapted to hold a cage-shaped carrier which is used to enclose an item to be treated, e.g., a wafer (hereinafter called "carrier holder"). On the other hand, a lid centrally defining an air intake port is provided over the casing while an exhaust port is formed in the circumferential wall of the casing at a suitable location thereof. When the rotor is driven, water droplets present on the surface of a wafer or the like are thrown by virtue of centrifugal forces applied thereto toward the circumferential wall of the casing. Since a negative pressure is developed at this time in a central region of the rotor, air is sucked into the rotor through the air intake port and is then caused to flow in a circumferential direction through the casing, and is eventually discharged through the exhaust port. The wafer or the like is dried up by the air stream.

Accordingly, water droplets stick on the circumferential wall of the casing. Besides, dusts and stains also stick on the circumferential wall of the casing. In an apparatus of the above type, the air in the casing does not flow in its entirety in the circumferential direction but a part of the air may flow in the radial direction. In some instances, air streams which flow in the radial direction strike against the circumferential wall and flow backward, thereby carrying water and stains on the circumferential wall back onto the wafer or the like. Such a prior art apparatus is thus accompanied by drawbacks that such radial air flows lower the drying efficiency and reduce the effectiveness of the washing treatment.

SUMMARY OF THE INVENTION

An object of this invention is to provide a spin drier which has overcome the above-described problems of the prior art apparatus and is capable of enhancing the drying efficiency while avoiding the sticking problem of stains.

In order to achieve the above object, main features of the present invention reside in that air streams striking against the circumferential wall of the casing have been minimized and the drainage of water has been effectively carried out.

Accordingly, the present invention provides a spin drier for silicon wafers and the like including a rotor equipped with at least one holder for a carrier, which is adapted to enclose a silicon wafer or the like therein, and a casing embracing the rotor, in which spin drier the radial distance between the circumferential wall of the casing and the central axis of the rotor gradually increases as the circumferential wall extends all around the rotor in its circumferential direction from a position adjacent to an air exhause port provided at a suitable location in the circumferential wall to the air exhaust port and the bottom wall of the casing gradually slopes down from the position adjacent to the air exhaust port toward the air exhaust port.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENT

Figure 1:
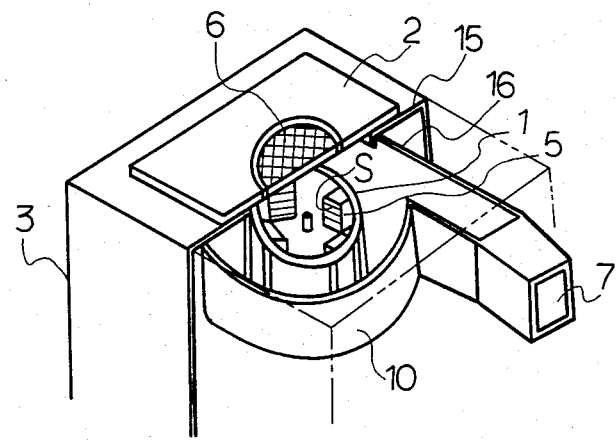
FIG. 1 is a perspective view of a spin drier in accordance with an example of this invention, in which about one half of the external housing has been cut away to give a better view of the rotor and casing.

FIG. 1 illustrates the overall construction of the spin drier in accordance with an example of this invention. Designated at numeral 1 is a rotor, which is enclosed in a casing 10. The rotor 1 and casing 10 are housed in an external housing 3 which is provided with a freely openable lid 2 at a location above the casing 10. As shown more clearly in FIG. 2, the rotor 1 is provided with a suitable number of holders adapted to fixedly hold their corresponding carriers. In the illustrated embodiment, four holders are provided. Needless to say, the number of such holders is not limited to four but may be either one or any other number. As depicted in FIG. 1, items to be treated, namely, wafers or the like S are respectively enclosed in their respective carriers 5, which are in turn supported on the rotor 1. The lid 2 centrally defines an air intake port 6 which is covered by a screen. An air exhaust port 7 is provided in a circumferential wall 11 of the casing 10 at a suitable location. Air, which has been introduced through the intake port 6 owing to rotation of the rotor 1, is caused to flow through the casing 10 and eventually to flow out through the exhaust port 7. Incidentally, as illustrated in FIG. 3, the rotor 1 is connected at the center thereof with a drive shaft 8 which can be rotated by means of a motor or the like.

Figure 2:
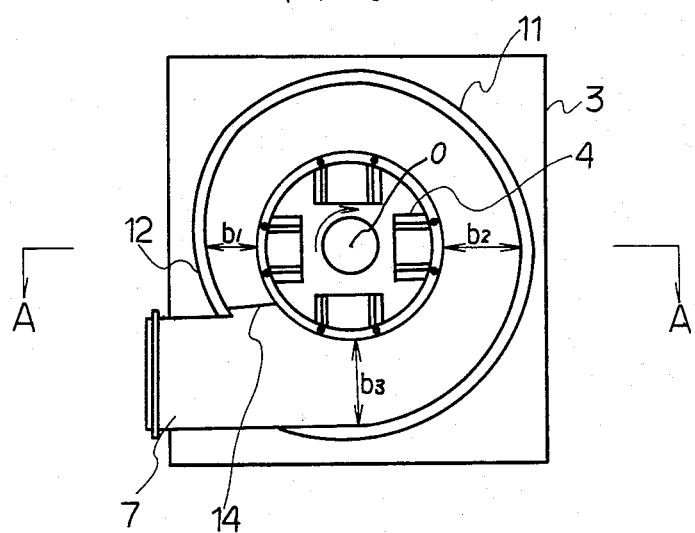
FIG. 2 is a top plan view of the spin drier, without the top wall of the external housing.
Figure 3:
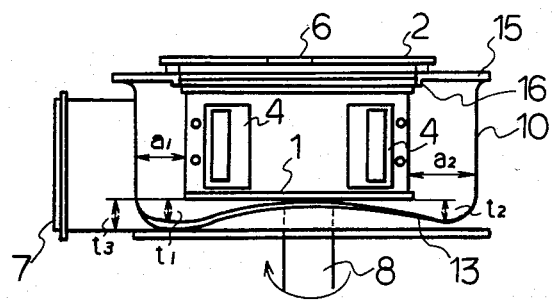
FIG. 3 is a cross-sectional view taken along line A—A of FIG. 2.

The main features of this invention resides, as shown in FIG. 2, in that the radial distance between the circumferential wall 11 of the casing 10 and the central axis O of the rotor 1 gradually increases as the circumferential wall 11 extends all around the rotor 1 from a position 12 adjacent to the exhaust port 7 provided with the casing 10 to the exhaust port 7 as well as a bottom wall 13 of the casing 3 gradually slopes down from the position 12 adjacent to the exhaust port 7 circumferentially around toward the exhaust port 7. Thus, the conduit width b1 at the position 12 of the casing 10 is narrower than the conduit width b2 at a position diametrically opposite to the position 12. The conduit width b2 is in turn narrower than the conduit width b3 at a position slightly upstream the exhaust port 7.

Supposing the vertical distances between the bottom wall 13 and the lower face of the rotor 1 to be t1, t2 and t3 respectively at the position 12 adjacent the exhaust port 7, the position diametrically opposite to the position 12, and the position slightly upstream of the exhaust port 7, t1<t2<t3. It is desirous that the bottom wall 13 is higher at its central region than at its peripheral region.

Since the bottom wall 13 slopes down toward the exhaust port 7 in the circumferential direction and also radially outwardly of the axis O as mentioned above, a step 14 is provided at the position 12 adjacent the exhaust port 7. Owing to the above-described construction of the casing 10, the circumferential air conduit defined by the casing 10 becomes wider in its cross-sectional area as it approaches the exhaust port 7, thereby reducing the resistance to air steam to be flown therethrough and facilitating the intake and exhaust of air. In addition, it is preferable that, as shown in FIG. 1, the upper edge of the exhaust port 7 lies in substantially the same plane as the upper wall of the annular air conduit in the casing 10. Accordingly, there is no step between the air conduit and the exhaust port 7 and the air flow thus encounters only a little resistance when it is discharged through the exhaust port 7. The smoother discharge of air permits to intake more air, to develop stronger air stream, and thus to shorten the time required to dry up the wafers or the like.

In order to remove water from silicon wafers and dry same by the above spin drier, the silicon wafers are placed in the carriers 5 and the carriers 5 are then attached to the holders 4 of the rotor 1. After closing the lid 2, the rotor 1 is rotated. Each of the wafers is rotated due to the rotation of the rotor 1 and water droplets stuck on the wafer are thrown off toward the periphery owing to centrifugal forces applied thereto, thereby removing water droplets from the wafers. At the same time, a negative pressure is developed at a central region of the rotor 1 and induces fresh air to flow in through the intake port 6. The thus-introduced air then flows outwardly in the radial direction through spacings between wafers and in the circumferential direction along the circumferential wall 11 of the casing 10, and is finally discharged through the exhaust port 7. Thus, the wafers are dried up by such an air stream.

In the above spin drier, the air conduit of the casing 10 becomes gradually larger in its cross-sectional area toward the downstream. Thus, the air stream encounters only a little resistance. Even if a part of the air strikes against the peripheral wall 11 and flows backward, the part of the air is taken in the main air stream flowing in the circumferential direction and almost no air is therefore allowed to flow back onto wafers after striking against the circumferential wall 11. Furthermore, since the bottom wall 13 gradually slopes down toward the downstream, water dripped down from the circumferential wall 11 of the casing 10 is allowed to flow along the bottom wall 13 and is then smoothly discharged.

It is also feasible to provide a circular pendant wall 16 along the inner circumferential edge of the top wall 15 of the casing 10 if necessary. Provision of such a circular pendant wall serves to prevent air from flowing back downwardly into the central region of the rotor 1.

According to this invention, the air stream in the casing is allowed to flow at a relatively high speed owing to lowered resistance thereto, whereby effectively drying up wafers or the like. In addition, the above air stream prevents air from flowing back into the rotor and thus effectively prevents stains and/or water on the circumferential wall of the casing from sticking back onto the wafers or the like in the rotor. Owing to the development of a high speed air stream through the casing, it is unnecessary in some instances to provide in the casing vanes for inhibiting air from flowing back into the rotor. The above spin drier features only a little water flowing back from the circumferential wall onto wafers or the like in the rotor. This feature is one of reasons for the high-speed drying operation which can be carried out in the above spin drier. Furthermore, the above spin drier permits smooth drainage of water, thereby making the drying operation more efficient.

Having now fully described the invention, it will be apparent to one of ordinary skill in the art that many changes and modifications can be made thereto without departing from the spirit or scope of the invention as set forth herein.

What is claimed is:

1. In a spin drier for silicon wafers and the like including a rotor equipped with at least one holder for a carrier, which is adapted to enclose a silicon wafer or the like therein, and a casing embracing the rotor, the improvement comprising a radial distance between a circumferential wall of the casing and a central axis of the rotor gradually increasing as the circumferential wall extends around the rotor in its circumferential direction from a position adjacent an air exhaust port provided at a selected location in the circumferential wall to an air exhaust port; a bottom wall of the casing gradually sloping downwardly in a direction parallel to the central axis from the position adjacent the air exhaust port circumferentially around to the air exhaust port; and means defining an air intake port above the rotor and adjacent the central axis.

2. A drier as claimed in claim 1, wherein an upper edge of the air exhaust port lies in substantially the same plane as a top wall of an air conduit formed in the casing.

3. A drier as claimed in claim 1, wherein the casing is enclosed in an external housing.

4. A drier as claimed in claim 3, wherein the external housing is provided at a location above the casing with a freely openable lid which centrally defines the air intake port covered by a screen.

5. A drier as claimed in claim 1, wherein the bottom wall of the casing is higher at its central region than at its peripheral region.

6. A drier as claimed in claim 1, wherein a top wall of the casing is provided with a circular wall pendant from an inner peripheral edge thereof, whereby preventing air from flowing downwardly back into the rotor.

* * * * *